US010877138B2

(12) United States Patent
Spiegel

(10) Patent No.: US 10,877,138 B2
(45) Date of Patent: Dec. 29, 2020

(54) METHOD FOR TRANSMITTING DATA REPRESENTING ULTRASONIC MEASUREMENT SIGNALS, IN PARTICULAR IN A VEHICLE

(71) Applicant: Elmos Semiconductor SE, Dortmund (DE)

(72) Inventor: Egbert Spiegel, Dortmund (DE)

(73) Assignee: Elmos Semiconductor SE, Dortmund (DE)

( * ) Notice: Subject to any disclaimer, the term of this patent is extended or adjusted under 35 U.S.C. 154(b) by 253 days.

(21) Appl. No.: 16/043,488

(22) Filed: Jul. 24, 2018

(65) Prior Publication Data

US 2019/0033436 A1  Jan. 31, 2019

(30) Foreign Application Priority Data

Jul. 28, 2017 (EP) ..................................... 17183696

(51) Int. Cl.
*G01S 7/53* (2006.01)
*G01S 15/93* (2020.01)
(Continued)

(52) U.S. Cl.
CPC ................ *G01S 7/53* (2013.01); *G01S 7/003* (2013.01); *G01S 7/5273* (2013.01);
(Continued)

(58) Field of Classification Search
CPC .......... G01S 7/53; G01S 7/003; G01S 7/5273; G01S 15/931; G01S 2015/932; H03M 7/30
See application file for complete search history.

(56) References Cited

U.S. PATENT DOCUMENTS 4,906,995 A  *  3/1990  Swanson ................. H03M 7/30
                                                    324/520
2019/0033436 A1* 1/2019  Spiegel .................... G01S 7/003

FOREIGN PATENT DOCUMENTS

CN           109307858 A  *  2/2019  ........... G01S 15/931
DE   10 2013 015 402 A1     4/2015
(Continued)

OTHER PUBLICATIONS

European Search Report issued in European Patent Application No. 18 18 4164 dated Dec. 14, 2018.
(Continued)

*Primary Examiner* — Daniel Pihulic
(74) *Attorney, Agent, or Firm* — Mindful IP PLLC; Michael McCandlish

(57) ABSTRACT

In the method for transmitting data representing an ultrasonic measurement signal of an ultrasonic measuring device, in particular for a vehicle, from a transmitter to a receiver a digitized analog ultrasonic measurement signal is provided in the transmitter. On the transmitter side the ultrasonic measurement signal is sampled at a multiple of its frequency and divided into individual successive blocks of sampling values. The sampling values of the sampled ultrasonic measurement signal are transformed in blocks into the frequency range. Those frequency portions of the spectrum whose amplitude is smaller than a presettable threshold value, or the frequency portions of the spectrum above an upper frequency limit value and/or below a lower frequency limit value are removed. The amplitude range covered by the remaining frequency spectrum is scaled by a scaling factor for further reduction of the data. The data of each block with the scaling factor assigned to the respective block are transmitted to the receiver. On the receiver side the scaling of the amplitude range of the frequency spectrum of each (Continued)

block is reversed using the respective scaling factor and the frequency spectrum is transformed back into the time range.

6 Claims, 8 Drawing Sheets

(51) Int. Cl.
    *H03M 7/30*         (2006.01)
    *G01S 7/00*          (2006.01)
    *G01S 7/527*        (2006.01)
    *G01S 15/931*      (2020.01)

(52) U.S. Cl.
    CPC ............. *G01S 15/931* (2013.01); *H03M 7/30* (2013.01); *G01S 2015/932* (2013.01)

(56) References Cited

FOREIGN PATENT DOCUMENTS

| | | |
|---|---|---|
| DE | 102013015402 A1 | 4/2015 |
| EP | 0 273 820 A2 | 7/1988 |
| EP | 0273820 A2 | 7/1988 |
| EP | 1 231 482 A2 | 11/2001 |
| EP | 3 171 553 A1 | 5/2017 |
| EP | 3171553 A1 | 5/2017 |

OTHER PUBLICATIONS

Ludloff, A., "Praxiswissen radar und radarsignalverarbeitung", Praxiswissen Radar Und Radarsignalverarbeitung, Jan. 1, 1998.

* cited by examiner $$L = Ms + Mh - 1$$

| Ms | 0 |
|---|---|

| Mh | 0 |
|---|---|

Fig. 2

METHOD FOR TRANSMITTING DATA REPRESENTING ULTRASONIC MEASUREMENT SIGNALS, IN PARTICULAR IN A VEHICLE

RELATED APPLICATIONS

This application claims the benefit of priority to European Application No. 17183696.8 filed Jul. 28, 2017, the disclosure of which is incorporated in its entirety by reference herein.

FIELD OF THE INVENTION

The invention relates to a method for transmitting data representing an ultrasonic measurement signal of an ultrasonic measuring device, in particular for a vehicle, from a transmitter, in particular an ultrasonic sensor, to a receiver which is in particular a central unit (controller).

BACKGROUND OF THE INVENTION

Description of Related Art

Ultrasonic measuring devices are in particular used as parking assistance systems (USPA) in vehicles. However, ultrasonic measuring devices are to be designed for allowing an increasing amount of information concerning the environment of a vehicle to be collected in the future.

In the case of the conventional ultrasonic measuring devices operating in connection with ultrasonic transmitters and ultrasonic receivers, mostly in the form of ultrasonic transducers, the signal evaluation has so far predominantly taken place in the sensor module, that is remote from the controller (central unit) controlling the ultrasonic measuring device. The signal processing is essentially limited to the determination of the positions of recognized objects relative to the vehicle. This information is then transmitted from the sensor module and/or the sensor modules to the controller. Further data can be transmitted only to a limited extent in particular due to the limited data transmission rate of the data bus systems used for vehicles.

In EP-A-0 273 820 a method for measurement signal transmission from a transmitter to a receiver is described. Here, the measurement signal is subjected to a data compression prior to transmission and is then transformed from the time range into the frequency range. Thus in the frequency range signal portions exist at frequencies which are undesired. The previous data compression has been performed without any filtering of undesired signal components.

Further data transmission methods are known from DE-A-10 2013 015 402 and EP-A-3 171 553.

SUMMARY OF THE INVENTION

It is an object of the invention to improve the signal processing of ultrasonic measurement signals which are in particular supplied by a plurality of sensors. This includes in particular an efficient raw data transmission from the sensor modules to the central unit.

According to the invention, this object is achieved with a method for transmitting data representing an ultrasonic measurement signal of an ultrasonic measuring device, in particular for a vehicle, from a transmitter to a receiver, wherein in the method:

in the transmitter
  a digitized analog ultrasonic measurement signal is provided in reaction to an analog ultrasonic transmission signal emitted for detecting obstacles,
  on the transmitter side the ultrasonic measurement signal is sampled at a multiple of its frequency and divided into individual successive blocks of sampling values,
  the sampling values of the sampled ultrasonic measurement signal are transformed in blocks into the frequency range using a segmented fast convolution,
  those frequency portions of the spectrum whose amplitude is smaller than a presettable threshold value, or the frequency portions of the spectrum above an upper frequency limit value and/or below a lower frequency limit value are removed,
  the amplitude range covered by the remaining frequency spectrum is scaled by a scaling factor for further reduction of the data, and
  from the transmitter the data of each block with the scaling factor assigned to the respective block are transmitted to the receiver, and
in the receiver
  the scaling of the amplitude range of the frequency spectrum of each block is reversed using the respective scaling factor,
  the thus processed frequency spectrum is filtered out of the analog ultrasonic measurement signal provided in the transmitter by multiplication by filter coefficients of an optimum filter for extracting the signal shape of the analog ultrasonic transmission signal, and
  the thus filtered frequency spectrum is transformed in blocks back into the time range using an inverse segmented fast convolution.

According to the invention it is proposed to transmit the raw data of analog ultrasonic measurement signals in blocks using the segmented convolution, wherein merely the data of the relevant signal spectrum are transmitted using the segmented convolution. Thus a transmission of the sensor raw data to a central unit (controller) of the vehicle via a bus normally used in the automobile sector and having a "mean" data range (e. g. DSI3) can be realized at a high time resolution and a short latency time. A plurality of ultrasonic sensors can transmit raw data to the central unit for further, in particular integrative processing of the raw data of a plurality of and/or all connected ultrasonic sensors.

Due to the fact that, according to the invention, the data compression is carried out only after the ultrasonic measurement signal to be transmitted has been transformed into the frequency range, a filtering of the transformed signal, e. g. by removing frequencies whose signal portions are smaller than a set value or lie outside (i. e. above and/or below) the limit values, results in only the "wanted" signal portions being compressed. This procedure produces exacter results than in the case where the data compression is carried out before the transformation of the signal into the frequency range.

The Fourier transformation in blocks using a segmented fast convolution according to the invention offers advantages as compared with conventional methods. The filtering of the signal (for extracting that signal shape in the analog ultrasonic measurement signal which is attributable to reflections of the analog ultrasonic transmission signal from obstacles) can be carried out by convolution with the pulse response of an optimum filter. This convolution operation can be executed by multiplication after the transformation of the analog ultrasonic measurement signal into the frequency range in that the filter coefficients of the optimum filter assigned to the individual frequencies are multiplied by the signal portions of the frequency spectrum of the ultrasonic measurement signal at the respective frequencies. In other words, a multiplication of the frequency response of the filter by the frequency spectrum of the analog ultrasonic measurement signal is thus carried out. Due to this "detour via the frequency range" a lot of computer operations can be omitted.

Another distinctive feature of the concept according to the invention and thus a further departure from the previous USPA-systems is that the major part of the signal processing is no longer carried out in the sensor module but in the central unit (controller) by software ("software-defined USPA").

In the sensor module merely the digital-to-analog conversion of the analog ultrasonic measurement signal and the known and typically applied I/Q demodulation have to be carried out. Further, in the sensor module the fast Fourier transformation (FFT) in blocks with segmented convolution and the limitation of the frequency spectrum to the relevant signal frequency portions according to the invention is carried out. The concept according to the invention and thus the further compression step according to the invention include the so-called scaling in blocks, i. e. the reduction of bit words of higher resolution to bit words with a smaller number of bits. Thus the signal processing in the sensor module is limited to the processing of the sensor raw data alone which are then transmitted via the vehicle data bus of the USPA system in a compressed form in order to be then rescaled in blocks in the central unit (controller) and transformed back into the time range.

The concept according to the invention allows for generally all echo evaluation algorithms to be executed in software in the central control unit ("software-defined USPA"). In addition, a high flexibility of the system is offered when new signal evaluation functions are implemented. Moreover, standardized sensors can be used. On the whole, the invention assists in realizing automotive ultrasonic measuring systems of a higher quality.

According to an advantageous aspect of the invention it may be provided that the scaling is carried out by identifying, in an amplitude bit word having L bits and describing an amplitude value, that most significant bit of these L bits which is not equal to zero, and this most significant bit as well as, starting therefrom, the M next less significant bits of the amplitude bit word are converted to a reduction bit word of the length M+1 with M+1<L, wherein the scaling factor represents the number of those bits of the amplitude bit word which are more significant than the identified most significant bit not equal to zero of the amplitude bit word. According to an appropriate further aspect of the invention, when the identified most significant bit not equal to zero of the amplitude bit word is less significant than the (M+1)th bit, calculated as from the least significant bit of the amplitude bit word, these (M+1) bits of the amplitude bit words are the bits of the reduction bit word and the scaling factor represents the number L−(M+1).

Finally, it may be provided that, as stated above, the digitized analog ultrasonic measurement signal is subjected to an I/Q demodulation, wherein the frequency at which the I/Q demodulation is carried out is equal to the frequency of the ultrasonic measurement signal. The I/Q demodulation is carried out by mixing the AD-converted ultrasonic measurement signal with the carrier frequency (for determining the I-portion of the demodulation) on the one hand and the carrier frequency phase-shifted by 90° with respect thereto (for determining the Q-portion of the demodulation) on the other hand.

BRIEF DESCRIPTION OF THE DRAWINGS

Hereunder the invention is explained in detail on the basis of an exemplary embodiment with reference to the drawings in which:

FIG. 2 shows a schematic representation for illustrating the fast convolution.

DETAILED DESCRIPTION OF A PREFERRED EMBODIMENT OF THE INVENTION

In the conventional ultrasonic parking assistance systems, the signal processing of the receive channel is fully integrated in each sensor module. Besides an amplifier and an ADC, it is composed of the following digital function blocks:

demodulation/quadrature mixer
matched filter/pulse compression filter/correlation meter
absolute-value calculator
algorithms for "rendering more precise" the echo signals and for interference suppression, such as differentiation (FTC=fast time constant)
algorithms for automatic and manual threshold value generation
determination of the echo position (e.g. "echo peak detection")
echo evaluation according to height/surface area/signal-to-noise ratio
etc.

These functions are almost exclusively implemented in digital hardware. This is cost-effective but also inflexible. Although this drawback can be compensated for by an extensive parametrization, the actual algorithms can no longer be modified. An implementation in software on a correspondingly powerful digital signal processor (DSP) in each sensor module would be the solution but is too expensive at least for the time being.

When the echo data are combined in the central control unit, normally only the echo position and in very few cases also the echo height are available. For a more precise recognition of the environment it is desired to provide the complete envelope having a high resolution to the control unit. If the main part of the signal processing were realized in the central unit in the form of software, a very flexible system having functionally simple and standardized sensor modules would be available.

Figure 1:
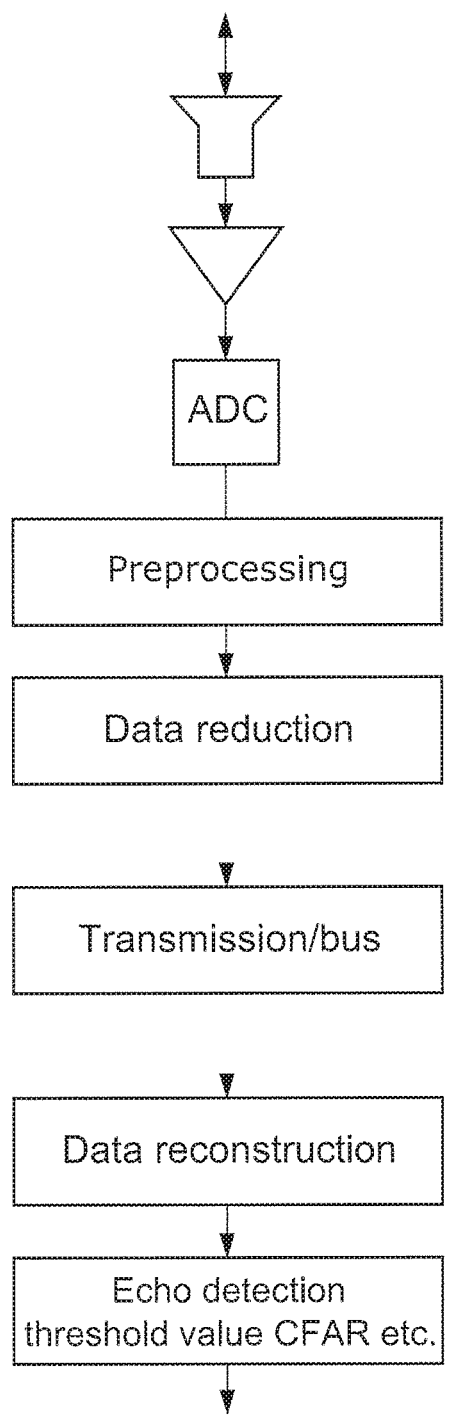
FIG. 1 shows the principle according to the invention of the USPA data compression.

In the case of currently used sensors the envelope is available in a time grid of ~20 μs with a 16-bit resolution. This means that per measuring period of 5 msec 500 bytes of data would have to be transmitted, for example. In contrast, the currently provided DSI3 bus which is considered fast has a net transmission rate of merely approximately 150 bytes/5 msec. It is therefore an object to provide a method where the amount of data is reduced without significantly affecting the signal quality. Such a system is schematically shown in FIG. 1.

1. Solution

The mathematical basis of the solution is the discrete convolution which is roughly described here. Literature concerning the discrete convolution is stated under [1], [2], [3], for example.

1.1 "Fast" Convolution

The filtering of a signal can be carried out by convolution with the pulse response of the filter:

$$g(t) = s(t) * h(t) = \int_{-\infty}^{\infty} s(\tau) h(t-\tau) d\tau$$

For discrete sequences the following can be derived:

$$g(n) = s(n) * h(n) = \sum_{m=-\infty}^{\infty} s(m) h(n-m)$$

The length of the convolution product is $$L = M_s + M_h - 1$$

For the Fourier transform of the discrete convolution the following applies:

$$s(n) * h(n) \circ\!\!-\!\!\bullet S(f) \cdot H(f)$$

i. e. after the transformation the convolution operation proceeds to a multiplication. However, depending on the length of the sequences, this apparent detour allows a lot of operations to be omitted, which explains the term "fast convolution".

Figure 2:
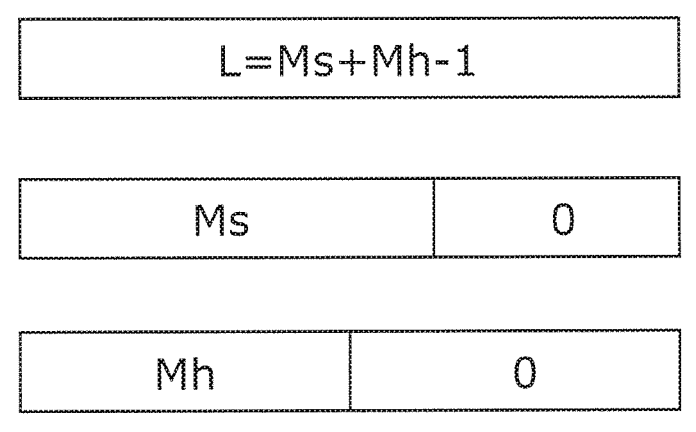

The calculation of the fast convolution using the fast Fourier transform (FFT) proceeds as follows (see also the schematic representation in FIG. 2):

1. Filling the sequences with zeros up to the length L
2. Fourier transformation of the sequences
3. Multiplication of the transformed sequences
4. Back-transformation (inverse Fourier transformation)

1.2 Segmented Convolution

Figure 3:
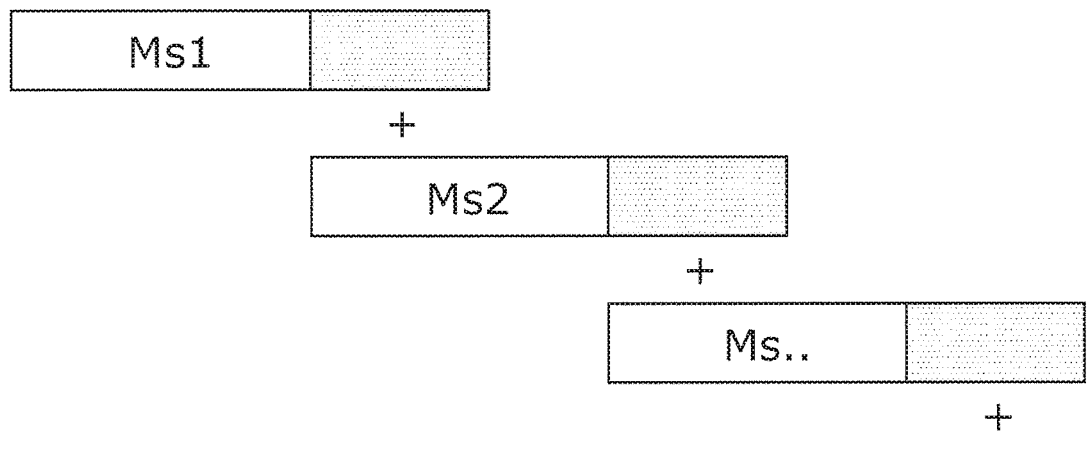
FIG. 3 shows a schematic representation for illustrating the segmented convolution, FIG. 4 exemplarily shows a spectrum of a 16-pulse ultrasonic burst in the sensor in relation to the center frequency.

In many cases the signal sequence is very long and/or infinitely long (continuous signal processing). Frequently, the memory is not large enough or no more delay/latency can be accepted. In this case the input sequence is partitioned into subsequences. After the convolution these sequences are added as is shown in the following figure ("overlap-and-add-method"—see FIG. 3), for example.

1.3 Description of the Invention on the Basis of an Exemplary Embodiment

The calculation of the envelope and the processing of the following algorithms are carried out in the time grid of ~20 μs (sampling frequency 50 kHz). The resolution is necessary for actually attaining the required absolute accuracy at the distance of <=1 cm (20 μs correspond to 3.4 mm).

Figure 4:
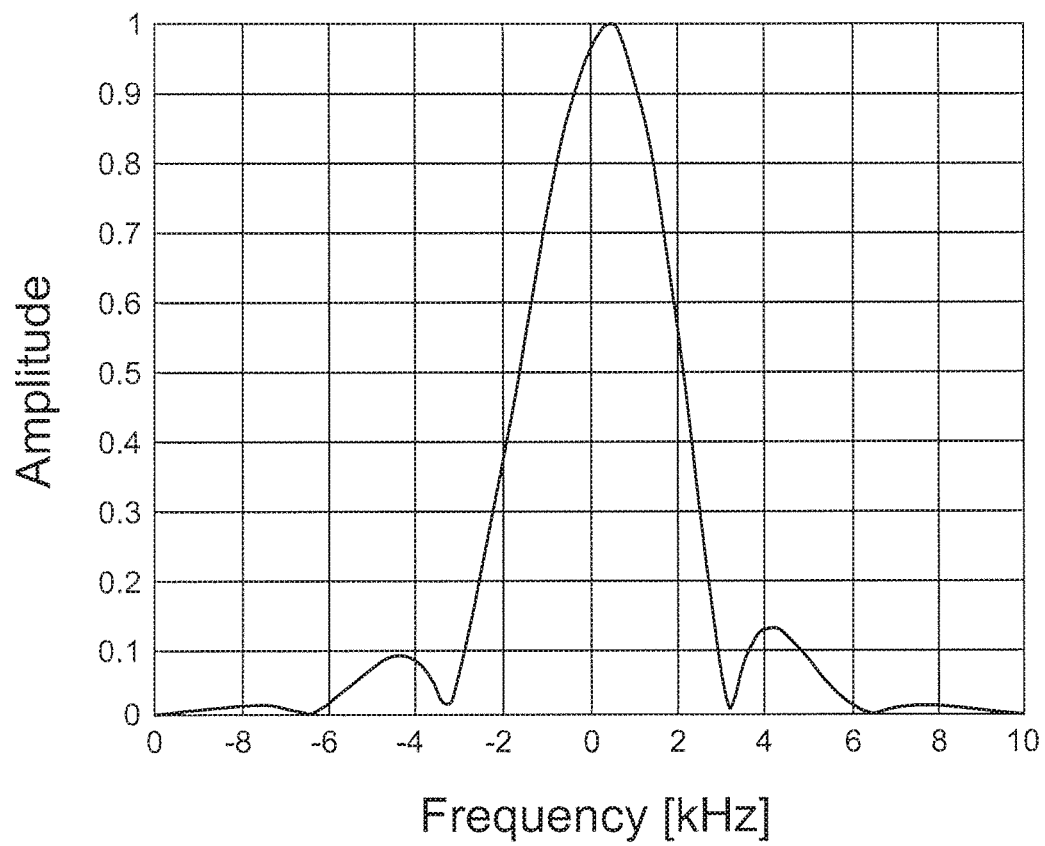

The frequency spectrum of an echo signal in the receiver, which has been emitted with 16 pulses, is observed. As compared to the representable bandwidth of +/−25 kHz the echo signal comprises a significant bandwidth of a maximum of +/−3 kHz (see FIG. 4).

Thus, if the signal transmission is carried out in the frequency range instead of the time range the major portion of the signal is obviously negligible. In this connection it is useful to place the matched filter also into the central control unit, in particular if it is a complex pulse compression filter (e.g. for chirp signals). Since the echo data are available as frequency data in the central control unit they can be very efficiently filtered in the central control unit according to the principle of a "fast convolution". For reducing the storing operation in the sensor and above all the latency time the measurement data are transformed in blocks into the frequency range. The basis for this is the so-called "segmented convolution". In addition, the segmentation offers the advantage that each section can be separately scaled and thus the amount of data can be reduced again at least by a factor of two. During the transmission this factor is added to the respective data package to reverse the scaling in the central unit.

Figure 5:
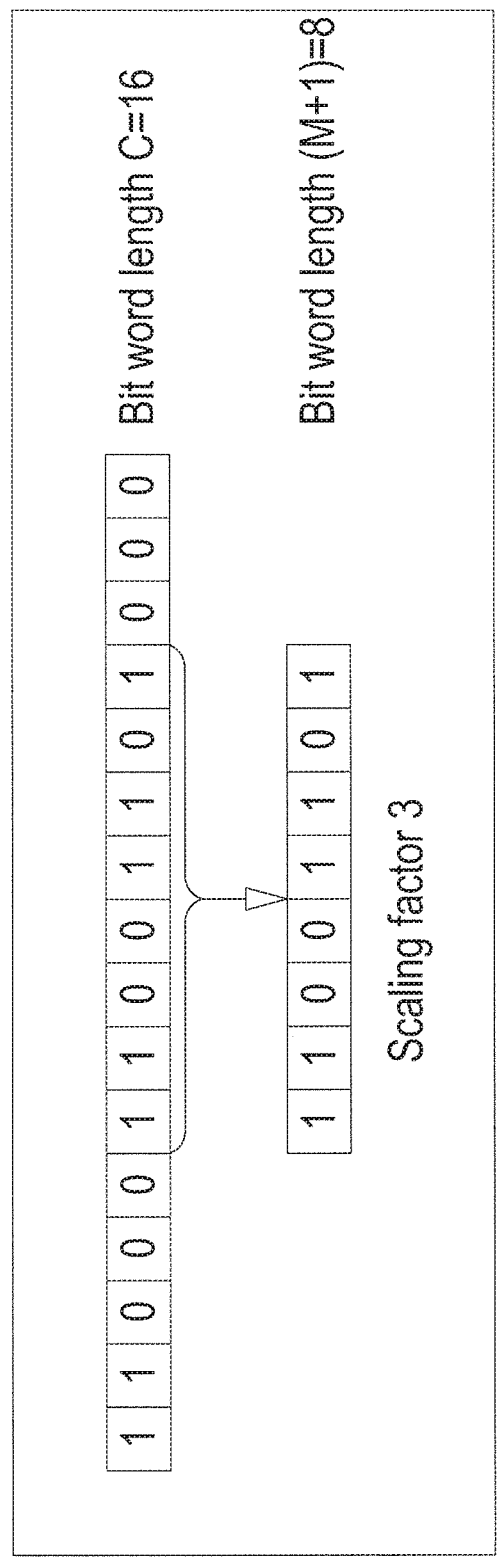
FIG. 5 shows a schematic representation of the scaling.

An example of the scaling of a bit word of the length L (L=16 bits) to a bit word of the length M+1 (e.g. 8 bits) is shown in FIG. 5. The most significant bit, which is not equal to zero, is searched in the bit word of the length L. In the example of FIG. 5 this is the fourth-most-significant bit. This bit as well as the next seven less significant bits are used as a reduced bit word of the length 8. The scaling factor is 3.

If the uppermost 8 bits of the exemplary 16-bit word are zero, the reduced bit word of the length 8 comprises the lowermost 8 bits of the 16-bit word.

Figure 6:
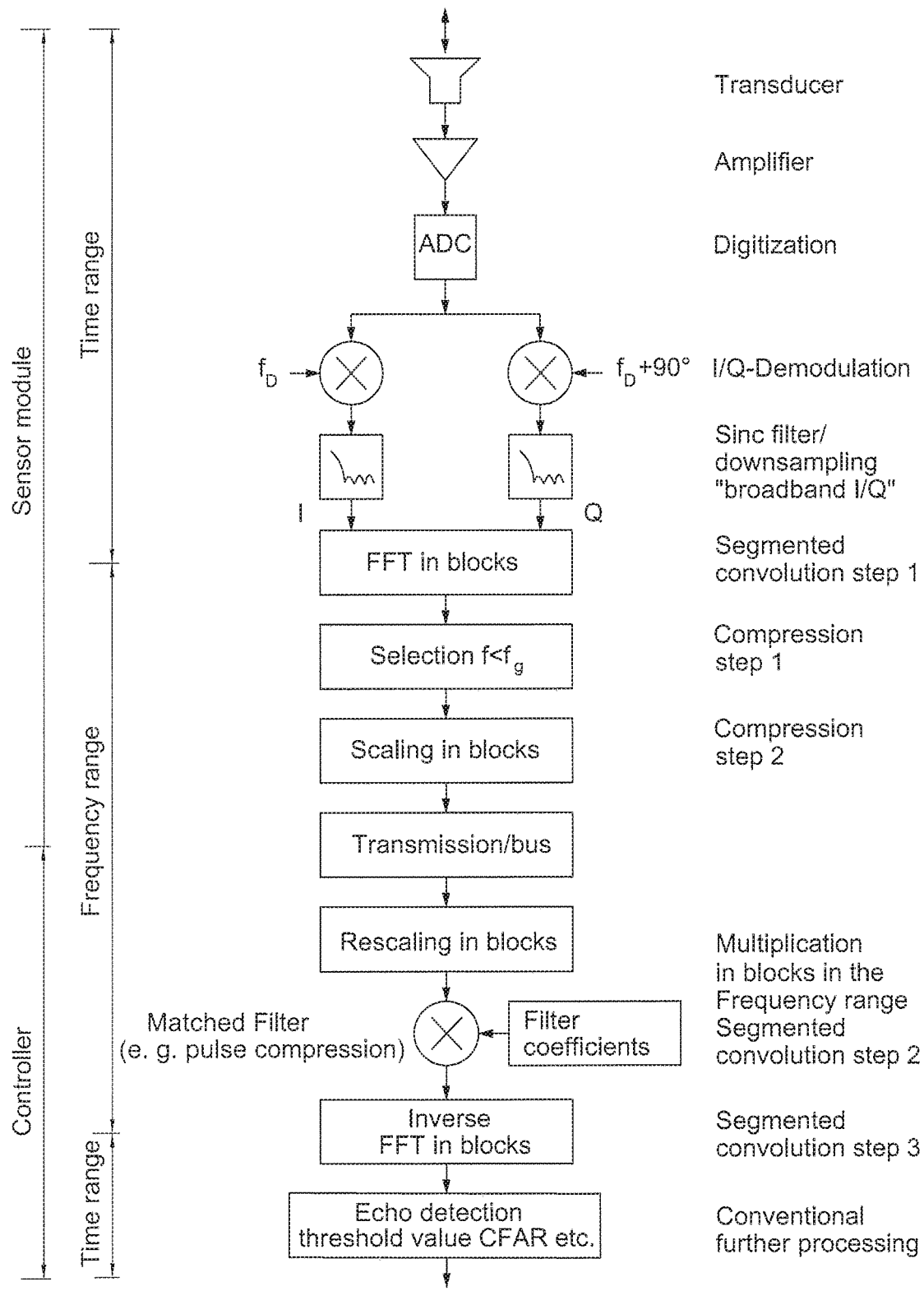
FIG. 6 shows a flow chart for an exemplary embodiment of the USAP data compression.

The application flow of the data compression, the transmission of the data as well as the back-transformation are shown in FIG. 6.

The signal is received by the transducer (receiver) and subsequently amplified and digitized. With the aid of a quadrature demodulator it is shifted to the frequency zero and partitioned into the in-phase portions (I) and the quadrature portions (Q). The sinc filter eliminates the higher-frequency components, in particular the portions are precisely eliminated at the mixer frequency (mainly caused by the offset of the amplifier and the ADC) and at twice the mixer frequency. Subsequently, the sampling rate is reduced, e. g. to one value per signal period (corresponding to ~20 μs, see above). The thus produced signal is also referred to as an analytic signal with I as a real portion and Q as an imaginary portion [4]. The complex-valued signal is now transformed in blocks into the frequency range using the fast Fourier transformation (FFT). Those frequency portions which exceed a specific limit frequency fg are rejected. The remaining values are now scaled (e. g. using a shift operation, multiplication by 2) such that they can be represented by a considerably shorter data word (e. g. 8 instead of 16 bits). Thereafter the transmission via the data bus is carried out.

In the central unit the data are first rescaled to their original value range. Subsequently, the filtering in the frequency range by multiplication by the frequency response of the filter is carried out. This is advantageous in that the filter need not be calculated: the frequency response is simply saved in the memory. In the last step a transformation back into the time range is carried out using an inverse Fourier transformation (IFFT). The further processing of the echo data, such as evaluation with static or dynamic threshold values (CFAR) etc. (see above), is subsequently carried out in a known manner.

Figure 7:
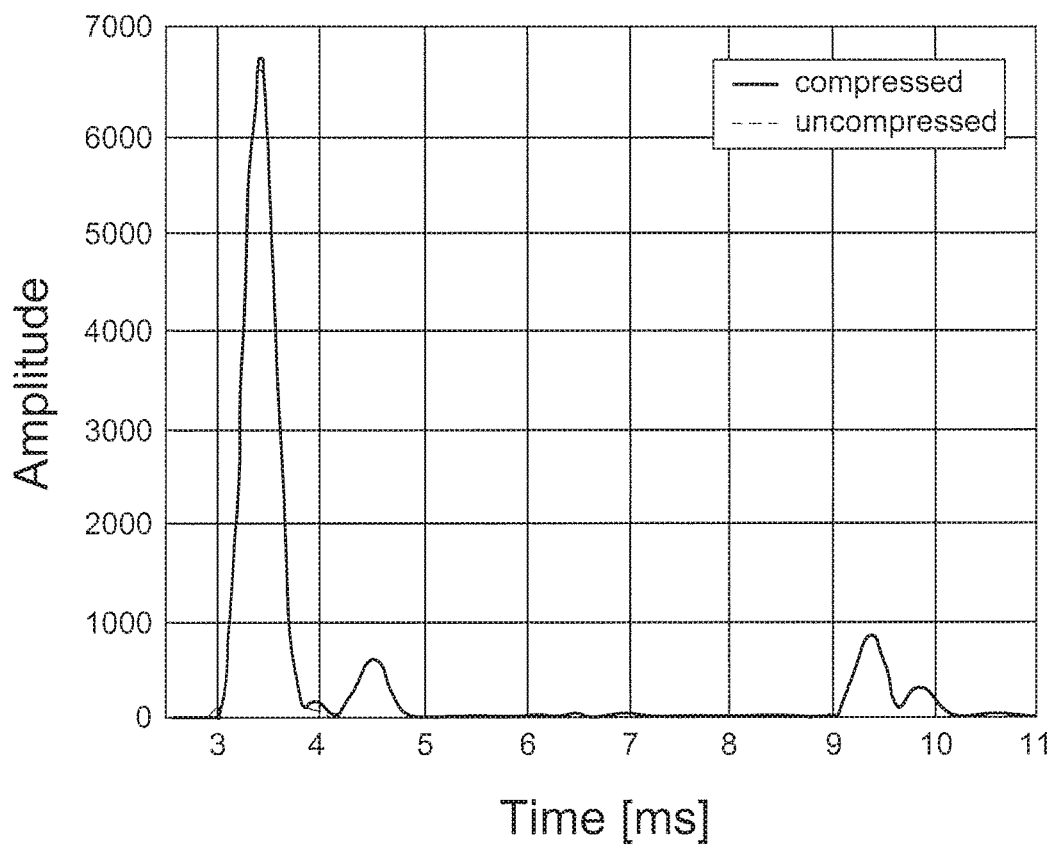
FIGS. 7 and 8 show curve shapes for comparison before and after a data compression.
Figure 8:
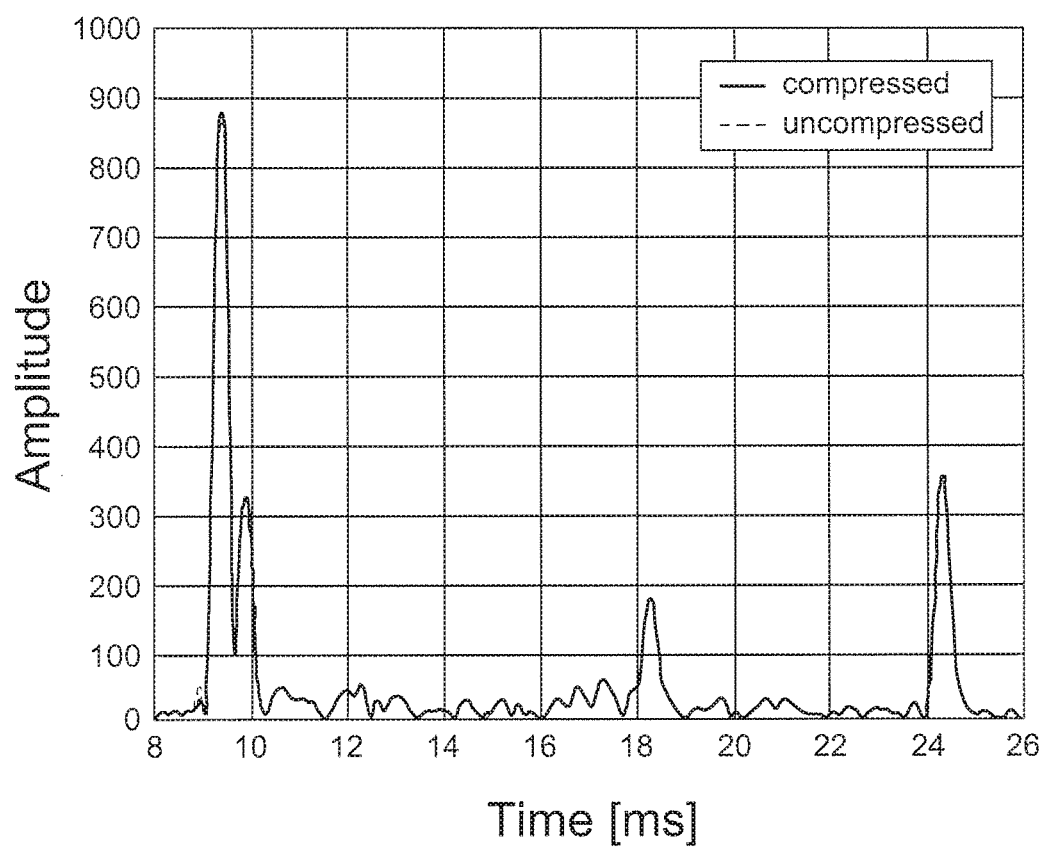

The curves of FIGS. 7 and 8 show the differences between a data-reduced and a not-data-reduced signal.

Transmission frequency 50 kHz, sampling time after demodulation 20 μs

Original data rate: 500 bytes/5 msec

Reduced data rate: 62 bytes/5 msec

Bandwidth (as per FFT bins): +/−2.4 kHz
FFT length L=64
Length of pulse response of the matched filter Nh=16
Block size: Ns=49 sampling values corresponding to 0.98 msec
Number of FFT bins taken into account (frequency values): 7
Word width of the transmitted values: 6 bits Although the invention has been described and illustrated with reference to a specific illustrative embodiment thereof, it is not intended that the invention be limited to that illustrative embodiment. Those skilled in the art will recognize that variations and modifications can be made without departing from the true scope of the invention as defined by the claims that follow. It is therefore intended to include within the invention all such variations and modifications as fall within the scope of the appended claims and equivalents thereof.

LITERATURE

[1] Albrecht Ludloff, "Praxiswissen Radar and Radarsignalverarbeitung"
[2] https://de.wikipedia.org/wiki/Schnelle_Faltung
[3] U.S. Pat. No. 5,502,747
[4] https://de.wikipedia.org/wiki/Analytisches_Signal

The invention claimed is:

1. A method for transmitting data representing an ultrasonic measurement signal of an ultrasonic measuring device, in particular for a vehicle, from a transmitter to a receiver, wherein in the method:

in the transmitter a digitized analog ultrasonic measurement signal is provided in reaction to an analog ultrasonic transmission signal emitted for detecting obstacles, the ultrasonic measurement signal is sampled at a multiple of its frequency and divided into individual successive blocks of sampling values, the sampling values of the sampled ultrasonic measurement signal are transformed in blocks into the frequency range using a segmented fast convolution, those frequency portions of the spectrum whose amplitude is smaller than a presettable threshold value, or the frequency portions of the spectrum above an upper frequency limit value and/or below a lower frequency limit value are removed, the amplitude range covered by the remaining frequency spectrum is scaled by a scaling factor for further reduction of the data, and from the transmitter the data of each block with the scaling factor assigned to the respective block are transmitted to the receiver, and in the receiver the scaling of the amplitude range of the frequency spectrum of each block is reversed using the respective scaling factor, the thus processed frequency spectrum is filtered out of the analog ultrasonic measurement signal provided in the transmitter by multiplication by filter coefficients of an optimum filter for extracting the signal shape of the analog ultrasonic transmission signal, and the thus filtered frequency spectrum is transformed in blocks back into the time range using an inverse segmented fast convolution.

2. The method according to claim 1, wherein the scaling is carried out by identifying, in an amplitude bit word having L bits and describing an amplitude value, that most significant bit of these L bits which is not equal to zero, and this most significant bit as well as, starting therefrom, the M next less significant bits of the amplitude bit word are converted to a reduction bit word of the length M+1 with M+1<L, wherein the scaling factor represents the number of those bits of the amplitude bit word which are more significant than the identified most significant bit not equal to zero of the amplitude bit word.

3. The method according to claim 2, wherein, when the identified most significant bit not equal to zero of the amplitude bit word is less significant than the (M+1)th bit, calculated as from the least significant bit of the amplitude bit word, these (M+1) bits of the amplitude bit words are the bits of the reduction bit word and the scaling factor represents the number L−(M+1).

4. The method according to claim 1, wherein the digitized analog ultrasonic measurement signal is subjected to an I/Q demodulation, wherein the frequency at which the I/Q demodulation is carried out is equal to the frequency of the ultrasonic measurement signal.

5. The method according to claim 2, wherein the digitized analog ultrasonic measurement signal is subjected to an I/Q demodulation, wherein the frequency at which the I/Q demodulation is carried out is equal to the frequency of the ultrasonic measurement signal.

6. The method according to claim 3, wherein the digitized analog ultrasonic measurement signal is subjected to an I/Q demodulation, wherein the frequency at which the I/Q demodulation is carried out is equal to the frequency of the ultrasonic measurement signal.

* * * * *